United States Patent [19]
Nakagawa

[11] Patent Number: 4,639,276
[45] Date of Patent: Jan. 27, 1987

[54] METHOD OF MAKING THYRISTOR WITH A HIGH TOLERABLE BIAS VOLTAGE

[75] Inventor: Tsutomu Nakagawa, Hyogo, Japan

[73] Assignee: Mitsubishi Denki Kabushiki Kaisha, Tokyo, Japan

[21] Appl. No.: 777,577

[22] Filed: Sep. 19, 1985

Related U.S. Application Data

[62] Division of Ser. No. 536,797, Sep. 28, 1983, abandoned.

[30] Foreign Application Priority Data

Sep. 28, 1982 [JP] Japan .................. 57-171415

[51] Int. Cl.⁴ .......................................... H01L 21/265
[52] U.S. Cl. .................... 148/1.5; 29/576 B; 148/187; 148/DIG. 165; 357/38; 357/91
[58] Field of Search .............. 148/1.5, 187; 29/576 B; 357/38, 91

[56] References Cited

U.S. PATENT DOCUMENTS

| | | | |
|---|---|---|---|
| 3,766,450 | 10/1973 | Voss et al. | 317/235 R |
| 4,027,051 | 5/1977 | Reuschel et al. | 148/DIG. 165 |
| 4,119,441 | 10/1978 | Haas et al. | 148/1.5 |
| 4,278,475 | 7/1981 | Bartko et al. | 148/1.5 |
| 4,311,534 | 1/1982 | Bartko et al. | 148/1.5 |

OTHER PUBLICATIONS

Platzöder et al, IEEE Trans. Electron Devices, ED-23, (1976), 805.
Schnöller, IEEE Trans. Electron Devices, ED-21, (1974), 313.
Haas et al, Jour. Electronic Materials, 5, (1976), 57.

*Primary Examiner*—Upendra Roy
*Attorney, Agent, or Firm*—Sughrue, Mion, Zinn, Macpeak & Seas

[57] ABSTRACT

A thyristor having a high tolerable voltage $V_{Bo}$ comprising a first emitter layer (3), a first base layer (1), a second base layer (2), a second emitter layer (4) covering the surface except for a gate region (5) of the second emitter layer, said layers being of alternating semiconductivity types, a first emitter electrode (6), a second emitter electrode (7) and a gate electrode (8) overlaying the gate region, wherein the gate region is formed over an area of the first base region having a higher impurity concentration than any other area of the first base layer. The area of highest impurity concentration may be formed by a process of pulling an ingot of silicon from the melt with a magnetic field applied perpendicular to the convection of silicon with the temperature at the desired area being higher than elsewhere or by a process of neutron irradiating a wafer of float-zone silicon with the highest neutron dose at the desired area.

7 Claims, 6 Drawing Figures

METHOD OF MAKING THYRISTOR WITH A HIGH TOLERABLE BIAS VOLTAGE

This is a division of application Ser. No. 536,797, filed 9/28/83, now abandoned.

BACKGROUND OF THE INVENTION

The present invention relates generally to a thyristor, and more particularly, to a thyristor having increased tolerance to overvoltage.

The features of the present invention are hereunder described with particular reference to p-gate thyristors, a typical example of which is shown in cross-section in FIG. 1. In this figure, an n-type semiconductor substrate forms an n-type base layer 1 (hereafter referred to as an $n_B$ layer). A p-type base layer 2 (hereafter called the $p_B$ layer) is formed on the upper surface of the $n_B$ layer 1. A p-type emitter layer 3 (hereafter called the $p_E$ layer) is formed on the lower surface of the $n_B$ layer 1. An n-type emitter layer 4 (hereafter called the $n_E$ layer) is formed on the upper surface of the $p_B$ layer 2 so as to partially surround it. A p-type gate region 5 results from that part of the surface $p_B$ layer 2 which is surrounded by the $n_E$ layer 4. An anode 6 is formed on the lower surface of the $p_E$ layer 3 and a cathode 7 is formed on the surface of the $n_E$ layer 4. A gate electrode 8 is formed on the surface of the p-type gate region 5. A bevel 9 is made around the edges of the $p_E$ layer 3, the $n_B$ layer 1, the $p_B$ layer 2, and the $n_E$ layer 4 so as to reduce the surface electric field. A surface stabilizing film 10 is made to adhere to the bevel 9. A p-n junction $J_1$ is formed between the $n_B$ layer 1 and the $p_E$ layer 3; a p-n junction $J_2$ is formed between the $n_B$ layer 1 and the $p_B$ layer 2; and a p-n junction $J_3$ is formed between the $p_B$ layer 2 and the $n_E$ layer 4.

With the thyristor having the construction shown in FIG. 1, the allowable reverse bias is determined by the tolerance of the p-n junction $J_1$ and the allowable forward bias is determined by the tolerance of p-n junction $J_2$. The tolerable bias across these two junctions is determined by the impurity concentration N of the $n_B$ layer 1 and the thickness $W_{nB}$ of the $n_B$ layer 1. If $J_1$ and $J_2$ are each step junctions, the tolerable voltage $V_{Bo}$ is given by $5.6 \times 10^{13} N^{-1}$ when the tolerable voltage is determined by avalanche breakdown. If a reverse bias $V_{Bo}$ is applied to each junction, the spread of the depletion layer W is given by $3.62 \times V^{\frac{1}{2}} \times N^{-\frac{1}{2}}$.

In most thyristors, the $n_B$ layer 1 is made of a single crystal silicon wafer fabricated by the floating zone (FZ) process. An example of the specific resistivity distribution of the FZ water in the radial direction is shown in FIG. 2, wherein the horizontal axis plots the radial location of a certain area as measured from the periphery of the wafer and the vertical axis shows the specific resistivity (in ohm-cm) of that area. Since the specific resistivity is virtually in inverse proprotion to the impurity concentration, the specific resistivity distribution may well be regarded as indicating the distribution of the impurity concentration. In FIG. 2, (a) indicates the region having the highest impurity concentration and (b) represents the region having lowest impurity concentration. Obviously, the variation in the impurity concentration of the FZ wafer is within ±15%.

In a conventional thyristor using an FZ wafer, the tolerable bias $V_{Bo}$ is the tolerable bias $V_{Bo(A)}$ at the region (A) shown in FIG. 1 that corresponds to area (a) having the highest impurity concentration so that the tolerable bias $V_{Bo}$ is determined by the impurity concentration of that area. No punch-through will occur if the thickness $W_{nB}$ of the $n_B$ layer 1 is greater than the spread W at the bias $V_{Bo(A)}$ of the depletion layer in that part (not shown) of the $n_B$ layer 1 which corresponds to area (b) of the lowest impurity concentration. Therefore, the tolerable bias $V_{Bo}$ of the thyristor is determined by the avalanche breakdown voltage $V_{Bo(A)}$ at area (A) of the $n_B$ layer 1. Accordingly, if a forward overvoltage greater than $V_{Bo(A)}$ is applied to the conventional thyristor using the FZ wafer, a local current flows in area (A) of the $n_B$ layer 1 to turn on the thyristor. While the turned-on area spreads slowly, a hot spot occurs in area (A) and may nonetheless destroy the thyristor. The same phenomenon will occur if an overvoltage is applied in reverse direction. However, it has been difficult to increase the tolerance of the conventional thyristor against overvoltage because the location of the area (A) of the $n_B$ layer 1 having the highest impurity concentration is usually unknown.

An improved version of the FZ wafer is commercially available which is given a relatively uniform distribution of impurity concentrations by converting $Si^{30}$ in an FZ wafer of high specific resistivity to $P^{31}$ through exposure to neutron radiation through a nuclear reaction some of the silicon is converted to phosphorous which is an n-type dopant. Called an NTD FZ wafer, this device has a specific resistivity profile in a radial direction of the type shown in FIG. 3, wherein the horizontal and vertical axes plot the same parameters as in FIG. 2, and (a) indicates the area having the highest impurity concentration and (b) represents the area having the lowest impurity concentration. As illustrated in FIG. 3, the variation in the impurity concentration of the NTD FZ wafer is within ±5% and the distribution of the impurity concentrations in this wafer is more uniform than that of the FZ wafer shown in FIG. 2. Nevertheless, the location of the area (A) in the $n_B$ layer 1 of a thyristor using this wafer having the highest impurity concentration is not precisely known, and therefore increasing the tolerance of the thyristor is no less difficult than in the case of the thyristor using the conventional FZ wafer.

SUMMARY

The present invention has been accomplished in order to eliminate these defects of conventional thyristors and the primary object of the invention is to provide a thyristor that is given an increased tolerance to overvoltage by forming a base layer of a first conductivity type which has a higher impurity concentration in the area beneath a gate region of a second conductivity type than in any other area of the base layer.

DETAILED DESCRIPTION OF THE PREFERRED EMBODIMENTS

Figure 1:
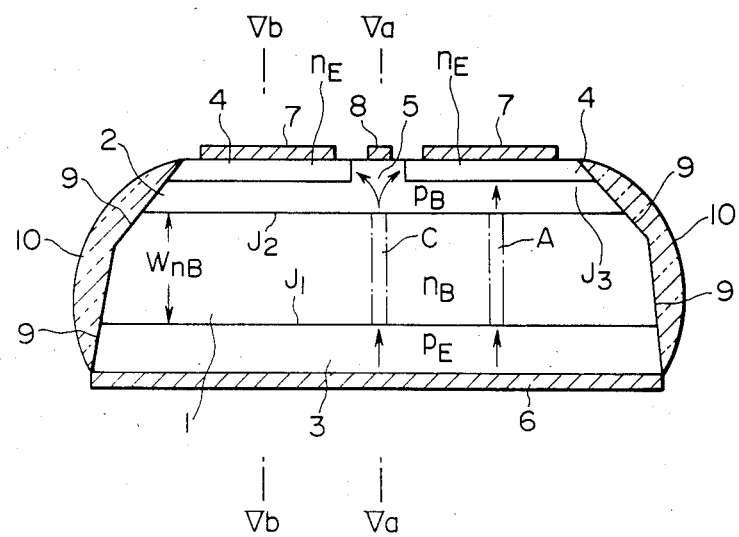
FIG. 1 is a cross-section of a p-gate thyristor illustrating an embodiment as practiced in the prior art as well as an embodiment of this invention.

A p-gate thyristor according to one embodiment of the present invention is characterized in that the area (C) of the $n_B$ layer 1 indicated in FIG. 1 which is beneath the p-gate region 5 has a higher impurity concentration than any other area of the $n_B$ layer 1. The operating principle of this p-gate thyristor is hereunder described by reference to FIG. 1.

When an overvoltage is applied to the thyristor in the forward direction, current flows from the $p_E$ layer 3 and passes through area (C) having the highest impurity concentration in the $n_B$ layer 1 and from thence through the p-type gate region 5 in the $p_B$ layer 2 before entering its interface with the $n_E$ layer 4. This current functions as the ordinary gate current and induces the injection of electrons into the $p_B$ layer 2 from the interface between the $n_E$ layer 4 and the p-type gate region 5. This injection of electrons turns on the greater part of the interface between the $p_B$ layer 2 and the $n_B$ layer 1. This turning-on does not produce any destructive hot spot in the $n_B$ layer 1, so the tolerance of the thyristor against overvoltage can be appreciably increased. The same effect can be obtained if a reverse overvoltage is applied to the thyristor.

The thyristor having this advantage can be easily fabricated from a wafer having a well defined area with the highest impurity concentration by arranging the wafer in such a manner that the area having the highest impurity concentration forms that part of the $n_B$ layer 1 which is beneath the p-gate region 5. A suitable wafer is an MCZ wafer having an impurity concentration distribution similar to that of the NTD FZ wafer. This MCZ wafer can be prepared by applying a magnetic field in a direction perpendicular to the convection of molten silicon from which an ingot of single-crystal silicon is pulld up by the Czochralski (CZ) process. A distribution wherein the impurity concentration is higher in the center than in the periphery can be obtained by manipulating the pulling of the ingot in such a manner that the temperature at the interface between the molten silicon and the ingot is higher in the center than at the periphery of the ingot.

Figure 2:
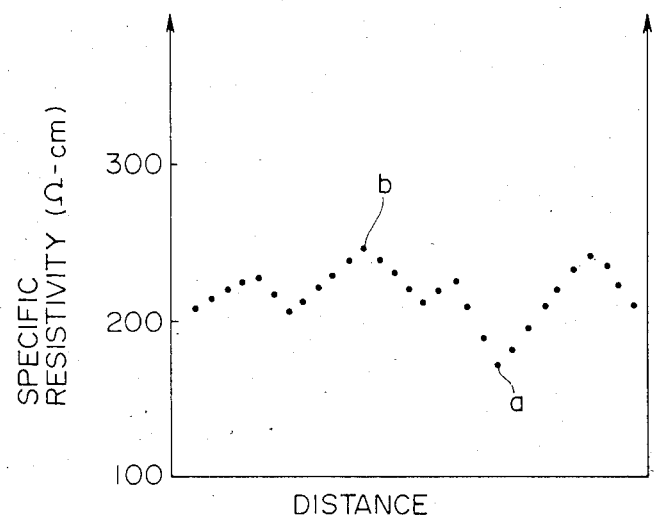
FIG. 2 is an example of the specific resistivity distribution in a radial direction of an FZ wafer that would be used as is in a prior art thyristor.
Figure 3:
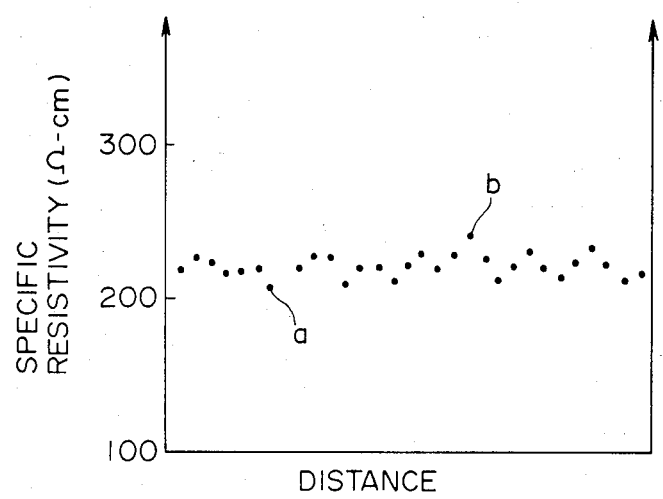
FIG. 3 is an example of the specific resistivity distribution in a radial direction of an NTD FZ wafer that would be used as is in a prior art thyristor.
Figure 4:
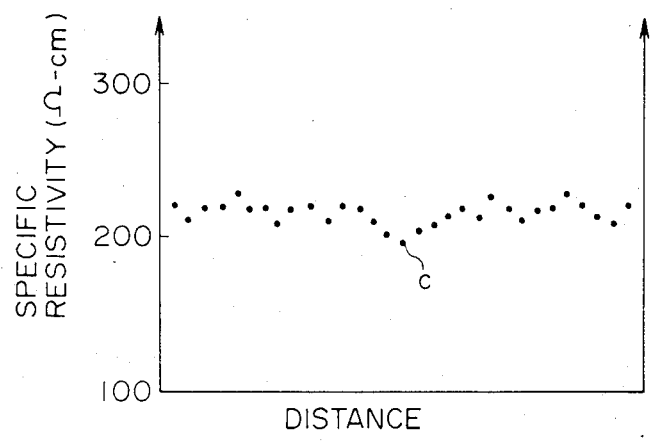
FIG. 4 is an example of the specific resistivity distribution of an MCZ wafer in a radial direction.
Figure 5A:
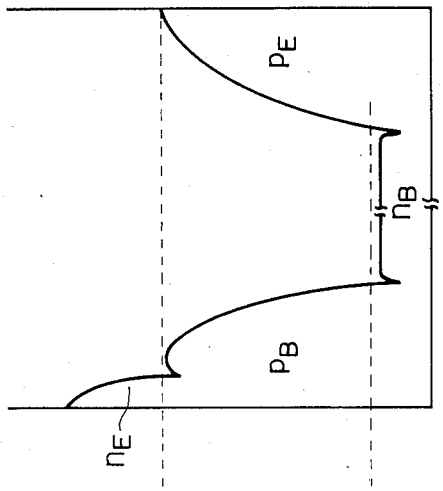
FIG. 5(a) is a diffusion profile of the p-gate thyristor of this invention as taken on the line Va—Va in FIG. 1 of this invention.
Figure 5B:
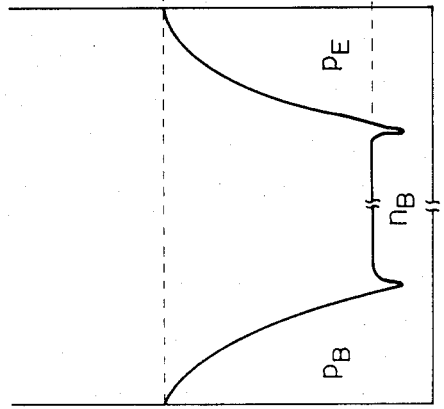
FIG. 5(b) is a diffusion profile of the same thyristor as taken on the line Vb—Vb.

An example of the specific resistivity distribution of the MCZ wafer in a radial direction is shown in FIG. 4, wherein the horizontal and vertical axes plot the same parameters as in FIG. 2. In FIG. 4, (c) indicates the center of the MCZ wafer which has the highest impurity concentration. Obviously, the variation in the impurity concentration of the MCZ wafer is of the same order as that in the impurity concentration of the NTD FZ wafer shown in FIG. 3, and in addition, the impurity concentration in the center is higher than in the peripheral area.

The NTD FZ wafer may also be used in the thyristor of the present invention. In this case, the desired wafer having a profile wherein the impurity concentration is higher in the center than in the periphery can be obtained by exposing the center of an FZ wafer to a higher dose of neutron radiation than that applied to the peripheral area.

A method of fabricating a thyristor using the present invention is now summarized. A semiconductor of n-type conductivity, in this example, is required which has an impurity concentration higher at its center than anywhere else. Of course, a wafer with its impurity concentration peaked elsewhere than its center could be used, but less advantageously. A p-type dopant is diffused into both the upper and lower surfaces of the wafer thereby forming a second base layer 2 as shown in FIG. 1 out of the upper p-doped region and a first emitter layer 3 of the lower p-doped region. The remaining n-type layer of the wafer becomes the first base layer 1. In a further diffusion step, an n-type dopant is diffused from above into the second base layer 2. However, this diffusion is allowed to only partially penetrate the second base layer 2, thereby forming a second emitter layer 4. Furthermore, the center of the wafer is masked during this latter diffusion so that a gate region 5 of the second base layer 2 is exposed at the upper surface of the wafer in the area of the wafer having the highest impurity concentration. Thereafter, a first emitter electrode 6 is formed on the lower surface of the first emitter layer 3, a second emitter electrode 7 is formed on part of the upper surface of the second emitter layer 4, and a gate electrode is formed on part of the exposed upper surface of the second base layer 2 corresponding to the gate region 5.

The foregoing description of the present invention refers to a p-gate thyristor, but it should be noted that the concept of the invention can also be applied to other thyristors such as an n-gate thyristor, amplified gate thyristor, FI gate thyristor and a photo-triggered thyristor.

As described above, in the thyristor of the present invention, that part of a base layer of the first conductivity type which is beneath a gate region of the second conductivity type has a higher impurity concentration than any other part of the base layer. So, when a forward or reverse overvoltage is applied, a current flows from the base layer into the gate region and functions as the ordinary gate current. This enables the greater part of the base layer to be turned on, and the tolerance of the thyristor against overvoltage can be increased without causing hot spots in the base layer.

I claim:

1. A process for fabricating a thyristor, comprising:
   preparing a semiconductor substrate of a first conductivity type by exposing said substrate to neutron irradiation in a pattern such that a central area of said substrate is exposed to a higher dose of neutron radiation than is the peripheral area, in order to form a higher impurity concentration at said central area;
   diffusing an impurity of a second conductivity type into the upper and lower surfaces of said substrate to form a base layer (2) of said second conductivity type on the upper surface thereof, and a first emitter layer (3) of said second conductivity type on the lower surface thereof;
   diffusing an impurity of said first conductivity type from the upper surface of said substrate to form a second emitter layer (4) on portions of said upper surface except for a central gate region (5) thereof, said gate region being formed over said central area.

2. A process for fabricating a thyristor, comprising the steps of:

preparing a silicon semiconductor substrate by a modified Czochralski process wherein an ingot of single-crystal silicon is pulled up with a magnetic field applied in a direction perpendicular to to the convection of molten silicon, said ingot being pulled up in a manner such that the temperature at the interface between the molten silicon and the ingot is higher in the central area than at the periphery;

diffusing an impurity of a second conductivity type into upper and lower surfaces of said semiconductor substrate, said substrate being of a first conductivity type and having a higher impurity concentration at a central area than at any other area thereof so as to form a second base layer of the second conductivity type on the upper surface and a first emitter layer of the second conductivity type on the lower surface, with that region sandwiched between said second base layer and said first emitter layer forming a first base layer; and diffusing an impurity of the first conductivity type from the upper surface of said substrate to form a second emitter layer which covers all but a gate region of the upper surface and is situated within the area defined by the second base layer, the surface of the gate region of the second base layer being exposed on said upper surface and including said central area.

3. A process for fabricating a thyristor, comprising the steps of:

preparing a silicon semiconductor substrate from a wafer fabricated by a floating zone process and exposed to neutron irradiation, the central area of the wafer being exposed to a higher dose of neutron radiation than the peripheral area thereof, diffusing an impurity of a second conductivity type into upper and lower surfaces of said semiconductor substrate, said substrate being of a first conductivity type and having a higher impurity concentration at a central area than at any other area thereof so as to form a second base layer of the second conductivity type on the upper surface and a first emitter layer of the second conductivity type on the lower surface, with that region sandwiched between said second base layer and said first emitter layer forming a first base layer; and diffusing an impurity of the first conductivity type from the upper surface of said substrate to form a second emitter layer which covers all but a gate region of the upper surface and is situated within the area defined by the second base layer, the surface of the gate region of the second base layer being exposed on said upper surface and including said central area.

4. A process for fabricating a thyristor, as recited in claim 2, wherein the first conductivity type is n-type and the second conductivity type is p-type.

5. A process for fabricating a thyristor, as recited in claim 2, further comprising the steps of:

forming a second emitter electrode (7) on that surface of said second emitter layer which is exposed on said upper surface;

forming a gate electrode (8) on that surface of said second base layer which is exposed on said upper surface; and forming a first emitter electrode (6) on that surface of said first emitter layer which is exposed on the lower surface.

6. A process for fabricating a thyristor, as recited in claim 3, wherein the first conductivity type is n-type and the second conductivity type is p-type.

7. A process for fabricating a thyristor, as recited in claim 3, further comprising the steps of:

forming a second emitter electrode (7) on that surface of said second emitter layer which is exposed on said upper surface;

forming a gate electrode (8) on that surface of said second base layer which is exposed on said upper surface; and forming a first emitter electrode (6) on that surface of said first emitter layer which is exposed on the lower surface.

* * * * *